(12) United States Patent
Koto

(10) Patent No.: US 7,710,145 B2
(45) Date of Patent: May 4, 2010

(54) SEMICONDUCTOR DEVICE AND METHOD FOR CONTROLLING THEREOF

(75) Inventor: Tomohiko Koto, Kasugai (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 12/349,979

(22) Filed: Jan. 7, 2009

(65) Prior Publication Data

US 2009/0174437 A1        Jul. 9, 2009

(30) Foreign Application Priority Data

Jan. 8, 2008    (JP)    ............................. 2008-001000

(51) Int. Cl.
    *H03K 19/003*    (2006.01)
(52) U.S. Cl. .......................................... 326/30; 326/33
(58) Field of Classification Search ................... 326/30, 326/31, 33; 327/530, 538
    See application file for complete search history.

(56) References Cited

U.S. PATENT DOCUMENTS

| | | | | |
|---|---|---|---|---|
| 6,127,849 A | * | 10/2000 | Walker | 326/86 |
| 6,690,191 B2 | * | 2/2004 | Wu et al. | 326/30 |
| 7,271,614 B2 | * | 9/2007 | Khoo et al. | 326/30 |

FOREIGN PATENT DOCUMENTS

| | | |
|---|---|---|
| JP | 2000-258505 A | 9/2000 |
| JP | 2001-015684 A | 1/2001 |
| JP | 2004-088641 A | 3/2004 |

* cited by examiner

*Primary Examiner*—James Cho
(74) *Attorney, Agent, or Firm*—Arent Fox LLP

(57) ABSTRACT

A semiconductor device includes a circuit section having an output impedance which changes in accordance with a switching signal for switching between drive capabilities, and transforming an input signal into an output signal in accordance with the output impedance, a reference voltage generating section generating a reference voltage in accordance with the switching signal and the input signal, and a comparing section comparing a voltage of the output signal to the reference voltage.

20 Claims, 8 Drawing Sheets

SEMICONDUCTOR DEVICE AND METHOD FOR CONTROLLING THEREOF

CROSS REFERENCES TO RELATED APPLICATIONS

This application claims the benefit of priority of Japanese Patent Application No. 2008-001000 filed on Jan. 8, 2008, the entire contents of which are incorporated herein by reference.

BACKGROUND

1. Field

The present application relates to a semiconductor device and a method for controlling the semiconductor device.

2. Description of the Related Art

In Japanese Unexamined Patent Application Publication No. 2000-258505, a typical direct-current (DC)-test circuit is discussed which performs a DC test (an electric characteristics test) that is performed when a multiple-pin large scale integrated circuit (LSI) chip is to be shipped. The typical DC-test circuit includes the following elements: means for simultaneously inputting the same expected-value signals to a plurality of output buffers of an LSI chip; means for comparing output signals of the output buffers to a reference value to obtain a comparison result; means for generating one signal that can detect even one malfunctioned output buffer among many output buffers from the comparison result; and means for outputting the generated signal to an LSI tester from one terminal. The LSI tester detects whether or not the DC test has been normally performed by comparing input signals to a test signal.

In a typical DC test circuit, one signal is generated based on the comparison-result signal obtained by comparing the output signals of the output buffers to the reference value, when even one malfunctioning output buffer exists among the output buffers, indicating that the malfunctioned output buffer is detected. The one signal is output to the LSI tester, and the LSI tester detects whether the DC test has been normally or abnormally performed. Regardless of the number of pins, such as output pins of the LSI chip, the LSI tester performs the DC test using at least one monitor pin.

In Japanese Unexamined Patent Application Publications No. 2001-15684 and No. 2004-88641, technologies for performing operation tests on semiconductor circuits are discussed.

SUMMARY

According to aspects of the embodiments, a semiconductor device includes a circuit section having an output impedance which changes in accordance with a switching signal for switching between drive capabilities, and transforming an input signal into an output signal in accordance with the output impedance, a reference voltage generating section generating a reference voltage in accordance with the switching signal and the input signal, and a comparing section comparing a voltage of the output signal to the reference voltage.

DETAILED DESCRIPTION OF THE EMBODIMENTS

In order to adjust the drive capability of a semiconductor device, an output buffer having a plurality of different selectable drive capabilities is used.

In order to check whether a selected drive capability is set to a desired value in the output buffer having a plurality of different selectable drive capabilities, in some cases, a check test is performed for each of the selectable drive capabilities when the semiconductor device is to be shipped.

An increase in the number of selectable drive capabilities in the output buffer having a plurality of different selectable drive capabilities causes the time taken to perform the check test on each of the drive capabilities to be increased, which is different from a case of an output buffer having a fixed drive capability.

An increase in the time taken to perform the check test on each of the drive capabilities causes costs for the check test to increase.

According to any one of the embodiments described below, because a reference voltage is efficiently generated in accordance with a change in drive capability, a time taken to determine the magnitude relationship between voltages of output signals and the reference voltage is reduced. A time taken to perform a check test on drive capabilities is reduced by reducing the time taken to determine the magnitude relationship between voltages of output signals and the reference voltage. Thus, costs for the check test on drive capabilities, which corresponds to the time taken to perform the check test, are reduced.

A First embodiment will be described with reference to FIGS. 1 and 2.

Figure 1:
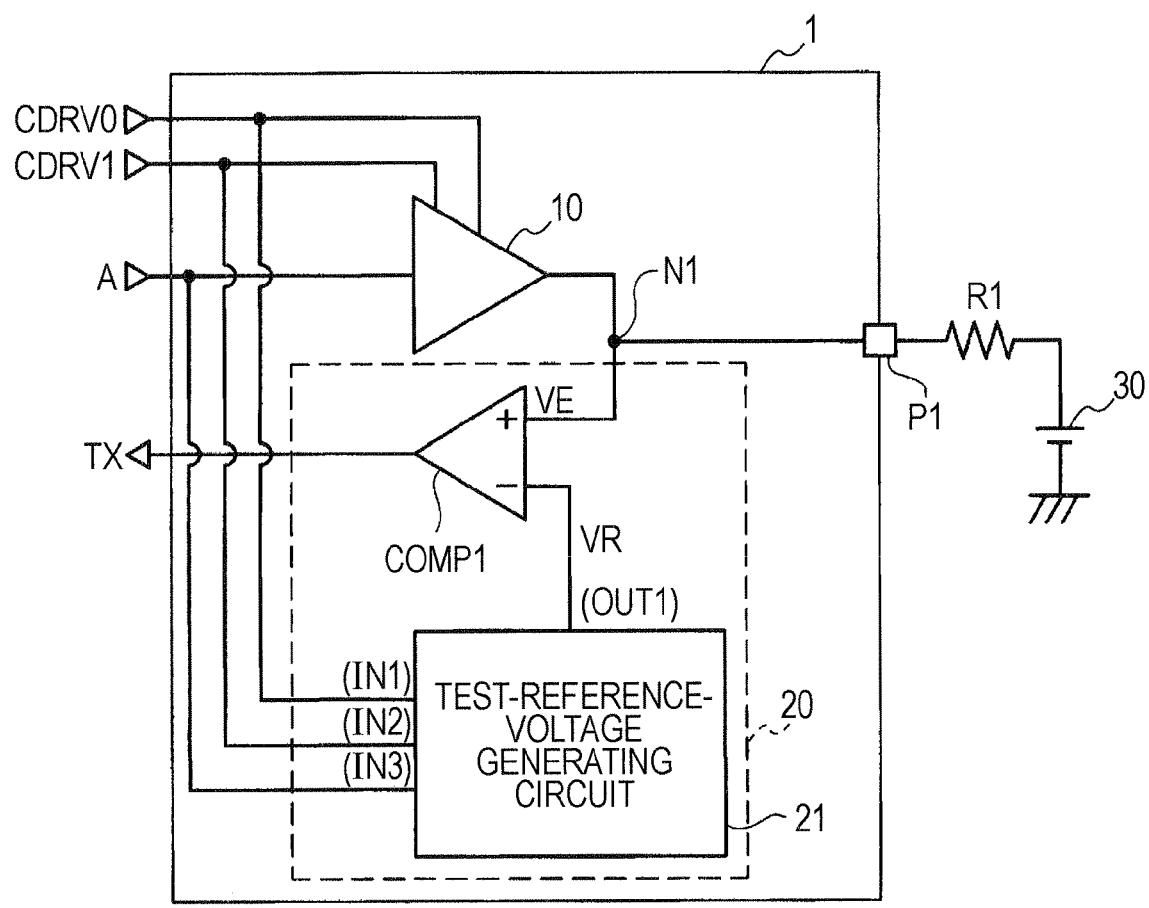
FIG. 1 illustrates a first embodiment.

FIG. 1 illustrates the first embodiment. A semiconductor device 1 illustrated in FIG. 1 includes an output buffer 10 and a drive-capability test circuit 20.

The drive-capability test circuit 20 includes a comparator COMP1 and a test-reference voltage generating circuit 21. A non-inverting input terminal of the comparator COMP1 is coupled to a node N1.

The node N1 is coupled to an external output terminal P1. The node N1 is coupled to the non-inverting input terminal of the comparator COMP1. A terminating resistor R1 and a power supply 30 are coupled in series between the external output terminal P1 and a ground.

Figure 2:
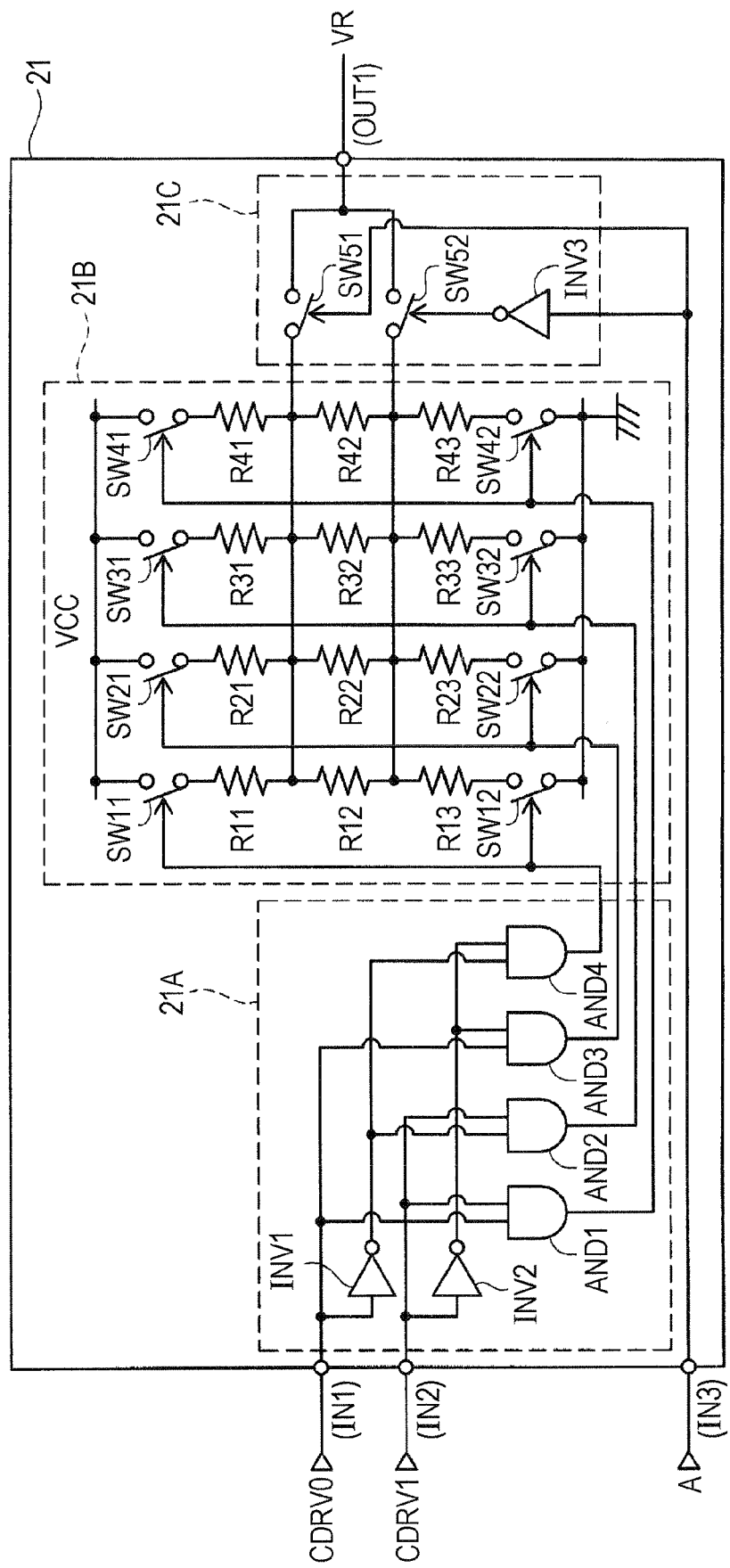
FIG. 2 illustrates a test-reference voltage generating circuit in the first embodiment illustrated in FIG. 1.

As illustrated in FIG. 2, the test-reference voltage generating circuit 21, which is also illustrated in FIG. 1, includes a generated-voltage control-signal producing circuit 21A, a voltage producing circuit 21B, and a produced-voltage selection circuit 21C.

The generated-voltage control-signal producing circuit 21A includes two inverters INV1 and INV2, and four AND gate circuits AND1 to AND4.

A first input of the first AND gate circuit AND1 is coupled to a first signal input terminal (IN1) of the test-reference voltage generating circuit 21. A second input of the first AND gate circuit AND1 is coupled to a second signal input terminal (IN2) of the test-reference voltage generating circuit 21.

A first input of the second AND gate circuit AND2 is coupled to the first signal input terminal (IN1) via the inverter INV1. A second input of the second AND gate circuit AND2 is coupled to the second signal input terminal (IN2).

A first input of the third AND gate circuit AND3 is coupled to the first signal input terminal (IN1). A second input of the third AND gate circuit AND3 is coupled to the second signal input terminal (IN2) via the inverter INV2.

A first input of the fourth AND gate circuit AND4 is coupled to the first signal input terminal (IN1) via the inverter INV1. A second input of the fourth AND gate circuit AND4 is coupled to the second signal input terminal (IN2) via the inverter INV2.

As further illustrated in FIG. 2, in the voltage producing circuit 21B, four voltage-dividing resistors are coupled in parallel between a power-supply voltage VCC of the output buffer 10 and the ground. The four voltage-dividing resistors include first to fourth voltage-dividing resistors. Different division ratios are set in the first to fourth voltage-dividing resistors.

Resistors R11, R12, and R13 are included in the first voltage-dividing resistor. Resistors R21, R22, and R23 are included in the second voltage-dividing resistor. Resistors R31, R32, and R33 are included in the third voltage-dividing resistor. Resistors R41, R42, and R43 are included in the fourth voltage-dividing resistor.

The first voltage-dividing resistor includes the resistors R11 to R13, which are coupled in series. One end of the resistor R11 is coupled to the power-supply voltage VCC via a switch SW11. One end of the resistor R13 is coupled to the ground via a switch SW12.

The second voltage-dividing resistor includes the resistors R21 to R23, which are coupled in series. One end of the resistor R21 is coupled to the power-supply voltage VCC via a switch SW21. One end of the resistor R23 is coupled to the ground via a switch SW22.

The third voltage-dividing resistor includes the resistors R31 to R33, which are coupled in series. One end of the resistor R31 is coupled to the power-supply voltage VCC via a switch SW31. One end of the resistor R33 is coupled to the ground via a switch SW32.

The fourth voltage-dividing resistor includes the resistors R41 to R43, which are coupled in series. One end of the resistor R41 is coupled to the power-supply voltage VCC via a switch SW41. One end of the resistor R43 is coupled to the ground via a switch SW42.

As further illustrated in FIG. 2, the produced-voltage selection circuit 21C includes selection switches SW51 and SW52, and an inverter INV3. One end of the selection switch SW51 is coupled to a coupling point between the resistors R11 and R12, a coupling point between the resistors R21 and R22, a coupling point between the resistors R31 and R32, and a coupling point between the resistors R41 and R42.

The other end of the selection switch SW51 is coupled to an inverting input terminal of the comparator COMP1 illustrated in FIG. 1 via an output terminal (OUT1). A third signal input terminal (IN3) of the test-reference voltage generating circuit 21 is coupled to the selection switch SW51.

One end of the selection switch SW52 is coupled to a coupling point between the resistors R12 and R13, a coupling point between the resistors R22 and R23, a coupling point between the resistors R32 and R33, and a coupling point between the resistors R42 and R43.

The other end of the selection switch SW52 is coupled to the inverting input terminal of the comparator COMP1 illustrated in FIG. 1 via the output terminal (OUT1).

The inverter INV3 is coupled between the third signal input terminal (IN3) and the selection switch SW52.

As further illustrated in FIG. 1, operation of a DC test performed in the semiconductor device 1 will be described. Here, measurement of drive capabilities of the output buffer 10 is performed as the DC test. In the semiconductor device 1, drive-capability switching control signals CDRV0 and CDRV1 are input to the output buffer 10. In the output buffer 10, for example, the size of an output transistor may be changed in accordance with the levels (high levels or low levels) of the drive-capability switching control signals CDRV0 and CDRV1. In the output buffer 10, the drive capability of the output transistor may be increased, for example, by increasing the size of the output transistor.

In the output buffer 10, the value of an output impedance may be reduced, for example, by increasing the size of the output transistor.

As further illustrated in FIG. 1, a data signal A is input to the output buffer 10. The data signal A has a logic level that is a low level or a high level. A voltage corresponding to the logic level of the data signal A is divided on the basis of the output buffer 10 and the terminating resistor R1. The data signal A corresponds to, for example, an input signal.

In the semiconductor device 1, an initialization value for obtaining the value of a voltage obtained by dividing the voltage corresponding to the logic level of the data signal A is set using the power supply 30. In the semiconductor device 1, a voltage VE is output from the node N1. The value of the voltage VE is set to the value of a divided voltage that is determined by the logic level of the data signal A, the terminating resistor R1, and the output impedance of the output buffer 10. Here, the initialization value may be set to, for example, a value that is half the power-supply voltage VCC illustrated in FIG. 2. The voltage VE is applied to the non-inverting input terminal of the comparator COMP1.

As further illustrated in FIG. 2, the drive-capability switching control signal CDRV0 is input to the generated-voltage control-signal producing circuit 21A via the first signal input terminal (IN1). The drive-capability switching control signal CDRV1 is input to the generated-voltage control-signal producing circuit 21A via the second signal input terminal (IN2).

One of the four AND gate circuits AND1 to AND4 outputs a switch control signal having a high level in accordance with a change in the level of the drive-capability switching control signal CDRV0 and/or the level of the drive-capability switching control signal CDRV1.

For example, when the levels of the drive-capability switching control signals CDRV0 and CDRV1 are low, the level of a signal indicating an AND result of the fourth AND gate circuit AND4 becomes high. When the fourth AND gate circuit AND4 outputs the switch control signal having a high level, the switches SW11 and SW12, which are coupled to the ends of the first voltage-dividing resistor including the resistors R11 to R13, are controlled by the switch control signal so that they are set to be in closed states.

As further illustrated in FIG. 2, the data signal A is input to the test-reference voltage generating circuit 21 via the third signal input terminal (IN3). When the level of the data signal A is high, the selection switch SW51 is controlled by the data signal A so that it is set to be in a closed state.

The test-reference voltage generating circuit 21 outputs a reference voltage VR from the output terminal (OUT1) via the selection switch SW51.

As further illustrated in FIG. 1, the reference voltage VR is applied to the inverting input terminal of the comparator COMP1. The value of the reference voltage VR is set to a value that is determined by the following equation:

Where $1/RC=1/R12+1/R22+1/R32+1/R42$, $$VR=VCC\times\{(RC+R13)/(R11+RC+R13)\} \quad (1)$$

As further illustrated in FIG. 2, the high level of the data signal A is inverted by the inverter INV3. When the level of the data signal A is high, the selection switch SW52 is controlled so that it is set to be in an open state.

In contrast, when the level of the data signal A is low, the selection switch SW51 is controlled so that it is set to be in an open state.

The selection switch SW52 is controlled by a high-level signal obtained by inverting the data signal A having a low level so that the selection switch SW52 is set to be in a closed state. The test-reference voltage generating circuit 21 outputs the reference voltage VR from the output terminal (OUT1) via the selection switch SW52. The value of the reference voltage VR is set to a value that is determined by the following equation:

Where $1/RC=1/R12+1/R22+1/R32+1/R42$, $$VR=VCC\times\{R13/(R11+RC+R13)\} \quad (2)$$

As further illustrated in FIG. 2, different selection switches are selected, in accordance with the difference in the level of the data signal A, as selection switches that are controlled to be set in closed states. Different division ratios are set by selecting the different selection switches as selection switches that are controlled to be set in closed states. When the different division ratios are set using the selection switches SW51 and SW52, the value of the reference voltage VR differs depending on the different division ratios.

In the semiconductor device 1 illustrated in FIG. 1, each of the different AND gate circuits illustrated in FIG. 2 outputs the switch control signal having a high level in accordance with a corresponding combination of the levels of the drive-capability switching control signals CDRV0 and CDRV1.

As further illustrated in FIG. 2, for example, when the level of the drive-capability switching control signal CDRV0 is high and the level of the drive-capability switching control signal CDRV1 is low, the third AND gate circuit AND3 outputs the switch control signal having a high level. The switches SW21 and SW22, which are coupled to the ends of the second voltage-dividing resistor including the resistors R21 to R23, are controlled by the switch control signal having a high level so that they are set to be in closed states.

In a case in which the switches SW21 and SW22 are controlled so that they are set to be in the closed states, when the level of the data signal A is high, the reference voltage VR is output from the output terminal (OUT1) via the selection switch SW51 as in the case in which the levels of the drive-capability switching control signals CDRV0 and CDRV1 are low. The value of the reference voltage VR is set to a value that is determined by the following equation:

Where $1/RC=1/R12+1/R22+1/R32+1/R42$, $$VR=VCC\times\{(RC+R23)/(R21+RC+R23)\} \quad (3)$$

When the level of the data signal A is low, the reference voltage VR is output from the output terminal (OUT1) via the selection switch SW52 as in the case in which the levels of the drive-capability switching control signals CDRV0 and CDRV1 are low. The value of the reference voltage VR is set to a value that is determined by the following equation:

Where $1/RC=1/R12+1/R22+1/R32+1/R42$, $$VR=VCC\times\{R23/(R21+RC+R23)\} \quad (4)$$

As further illustrated in FIG. 2, for example, when the level of the drive-capability switching control signal CDRV0 is low and the level of the drive-capability switching control signal CDRV1 is high, the second AND gate circuit AND2 outputs the switch control signal having a high level. The switches SW31 and SW32, which are coupled to the ends of the third voltage-dividing resistor including the resistors R31 to R33, are controlled by the switch control signal having a high level so that they are set to be in closed states.

When the level of the data signal A is high, the value of the reference voltage VR is set to a value that is determined by the following equation:

Where $1/RC=1/R12+1/R22+1/R32+1/R42$, $$VR=VCC\times\{(RC+R33)/(R31+RC+R33)\} \quad (5)$$

When the level of the data signal A is low, the value of the reference voltage VR is set to a value that is determined by the following equation:

Where $1/RC=1/R12+1/R22+1/R32+1/R42$, $$VR=VCC\times\{R33/(R31+RC+R33)\} \quad (6)$$

As further illustrated in FIG. 2, for example, when the levels of the drive-capability switching control signals CDRV0 and CDRV1 are high, the first AND gate circuit AND1 outputs the switch control signal having a high level. The switches SW41 and SW42, which are coupled to the ends of the fourth voltage-dividing resistor including the resistors R41 to R43, are controlled by the switch control signal having a high level so that they are set to be in closed states.

When the level of the data signal A is high, the value of the reference voltage VR is set to a value that is determined by the following equation:

Where $1/RC=1/R12+1/R22+1/R32+1/R42$, $$VR=VCC\times\{(RC+R43)/(R41+RC+R43)\} \quad (7)$$

When the level of the data signal A is low, the value of the reference voltage VR is set to a value that is determined by the following equation:

Where $1/RC=1/R12+1/R22+1/R32+1/R42$, $$VR=VCC\times\{R43/(R41+RC+R43)\} \quad (8)$$

In the first embodiment illustrated in FIG. 1, when the drive capability of the output buffer 10 is switched in accordance with one of the combinations of the levels of the drive-capability switching control signals CDRV0 and CDRV1, the selection switch SW51 or SW52 coupled to the ends of one of the first to fourth voltage-dividing resistors, which are illustrated in FIG. 2, is controlled so that the selection switch SW51 or SW52 is set to be in the closed state.

Because the first to fourth voltage-dividing resistors, which are illustrated in FIG. 2, have different voltage-dividing ratios, the value of the reference voltage VR differs depending on values of divided voltages generated using the individual voltage-dividing resistors.

As further illustrated in FIG. 1, the comparator COMP1 outputs a comparison-result signal TX indicating the comparison result between the voltage VE and the reference voltage VR. When the level of the data signal A is high, whether the level of the comparison-result signal TX is high or not is checked. If it is high, it may be determined that the drive capability of the output buffer 10 has been switched to a given drive capability.

When the level of the data signal A is low, it is checked whether the level of the comparison-result signal TX is low. If it is low, it may be determined that the drive capability of the output buffer 10 has been switched to a given drive capability.

As illustrated in FIG. 2, a time constant is determined by the first voltage-dividing resistor including the resistors R11 to R13 and parasitic capacitances that are coupled to the first voltage-dividing resistor. When the time constant is long, the value of the reference voltage VR gradually increases toward a target voltage value, or gradually decreases toward the target voltage value. Accordingly, when the time constant is long, the reference voltage VR that has been set to the target voltage value may be applied to the inverting input terminal of the comparator COMP1 in a test cycle time. Note that the test cycle time may be, for example, a time obtained by dividing a time taken to measure drive capabilities of the output buffer 10 by the number of cases in which the drive capabilities are measured. Here, the test cycle time is set to be equal to or shorter than one µs. In a conventional DC test, the drive capabilities of the output buffer 10 are measured with an LSI tester coupled to the external output terminal P1. Accordingly, a time of about 1 to 10 ms is taken as the test cycle time.

In the first embodiment, because the reference voltage VR that has been set to the target voltage value is applied to the inverting input terminal of the comparator COMP1 in the test cycle time, the resistances of the resistors R11 to R13 illustrated in FIG. 2 may be reduced.

The time constant that is determined by the resistances and the parasitic capacitances is made shorter by reducing the resistances of the resistors R11 to R13 illustrated in FIG. 2.

Figure 3:
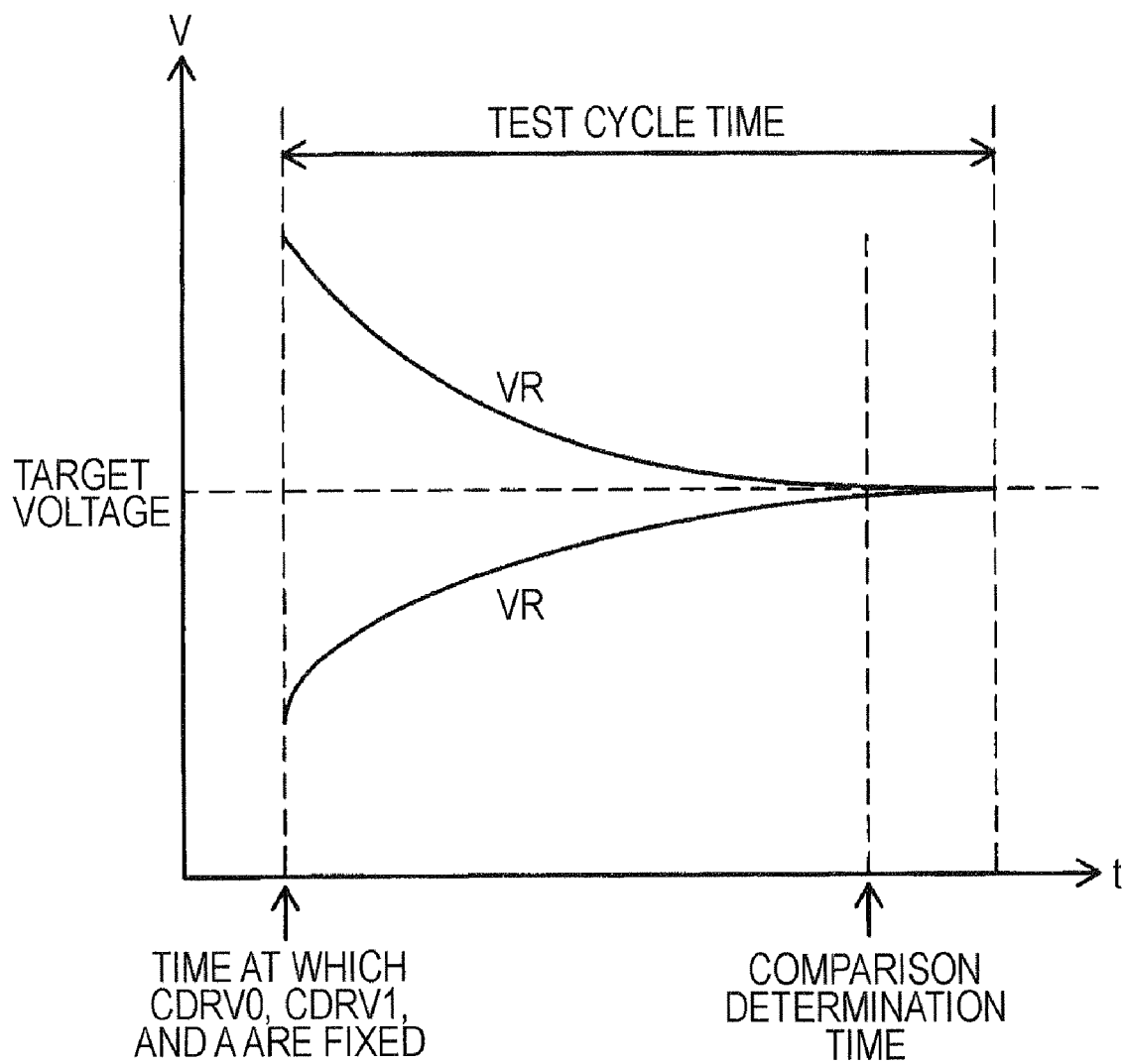
FIG. 3 illustrates a time chart representing changes in reference voltages VR in the first embodiment illustrated in FIG. 1.

As illustrated in FIG. 3, the value of the reference voltage VR reaches the target voltage value before a given test cycle time finishes after the levels of the drive-capability switching control signals CDRV0 and CDRV1, and the level of the data signal A were determined. Note that a comparison determination time illustrated in FIG. 3 is a time taken until the comparator COMP1 outputs the comparison-result signal TX.

The test cycle time is reduced by reducing the time taken to cause the value of the reference voltage VR to reach the target voltage value. When the test cycle time is reduced, a time taken to measure drive capabilities of the output buffer 10 is reduced.

As in the case of the resistors R11 to R13 illustrated in FIG. 2, a time constant that is determined by the second voltage-dividing resistor including the resistors R21 to R23 and parasitic capacitances, a time constant that is determined by the third voltage-dividing resistor including the resistors R31 to R33 and parasitic capacitances, and a time constant that is determined by the fourth voltage-dividing resistor including the resistors R41 to R43 and parasitic capacitances may be made shorter by reducing the resistances of the resistors R21 to R23 illustrated in FIG. 2, the resistances of the resistors R31 to R33 illustrated in FIG. 2, and the resistances of the resistors R41 to R43 illustrated in FIG. 2, respectively.

In the first embodiment, the output buffer 10 may correspond to, for example, a circuit section. The test-reference voltage generating circuit 21, which outputs the reference voltage VR that has different voltage values, may correspond to, for example, a reference voltage generating section.

Outputting the value of a voltage obtained by dividing a voltage corresponding to the logic level of the data signal A to the node N1 may correspond to, for example, an outputting operation. Outputting the reference voltage VR that has different voltage values in accordance with the combinations of the levels of the drive-capability switching control signals CDRV0 and CDRV1 and in accordance with the difference in the level of the data signal A may correspond to, for example, a reference voltage generating operation.

The comparator COMP1, which outputs the comparison-result signal TX indicating the comparison result between the voltage VE output from the node N1 and the reference voltage VR, may correspond to, for example, a comparing section.

Outputting the comparison-result signal TX indicating the comparison result between the voltage VE output from the node N1 and the reference voltage VR may correspond to, for example, a comparing operation.

The switch SW11, which is coupled between one end of the resistor R11 included in the first voltage-dividing resistor and the power-supply voltage VCC, and the switch SW12, which is coupled between one end of the resistor R13 included in the first voltage-dividing resistor and the ground, may correspond to, for example, switching parts.

The switch SW21, which is coupled between one end of the resistor R21 included in the second voltage-dividing resistor and the power-supply voltage VCC, and the switch SW22, which is coupled between one end of the resistor R23 included in the second voltage-dividing resistor and the ground, may correspond to, for example, switching parts.

The switch SW31, which is coupled between one end of the resistor R31 included in the third voltage-dividing resistor and the power-supply voltage VCC, and the switch SW32, which is coupled between one end of the resistor R33 included in the third voltage-dividing resistor and the ground, may correspond to, for example, switching parts.

The switch SW41, which is coupled between one end of the resistor R41 included in the fourth voltage-dividing resistor and the power-supply voltage VCC, and the switch SW42, which is coupled between one end of the resistor R43 included in the fourth voltage-dividing resistor and the ground, may correspond to, for example, switching parts.

The generated-voltage control-signal producing circuit 21A outputs, in accordance with one of the combinations of the levels of the drive-capability switching control signals CDRV0 and CDRV1, the switch control signal to corresponding switches coupled to the ends of one of the first to fourth voltage-dividing resistors. The generated-voltage control-signal producing circuit 21A, which outputs the switch control signal, may correspond to, for example, a closure-signal producing part.

In accordance with one of the combinations of the levels of the drive-capability switching control signals CDRV0 and CDRV1, outputting the switch control signal to corresponding switches coupled to the ends of one of the first to fourth voltage-dividing resistors may correspond to, for example, a closure-signal producing operation.

The selection switches SW51 and SW52 are controlled in accordance with the difference in the level of the data signal A so that either of the selection switches SW51 and SW52 is set to be in the closed state. The produced-voltage selection circuit 21C selects one divided voltage from among two divided voltages as the reference voltage VR. The produced-voltage selection circuit 21C, which selects one divided voltage as the reference voltage VR, may correspond to, for example, a voltage selection unit.

Controlling the selection switches SW51 and SW52 in accordance with the difference in the level of the data signal A so that either of the selection switches SW51 and SW52 is set to be in the closed state, and selecting one divided voltage from among two divided voltages as the reference voltage VR may correspond to, for example, a voltage selecting operation.

Generating divided voltages having different voltage values using the first to fourth voltage-dividing resistors having different division ratios may correspond to, for example, a voltage generating operation.

In the semiconductor device and method for controlling the semiconductor device according to the first embodiment illustrated in FIG. 1, the test-reference voltage generating circuit 21 generates, in accordance with the drive-capability switching control signals CDRV0 and CDRV1 and the data signal A, a reference voltage VR that has different voltage values.

The test-reference voltage generating circuit 21 changes the value of the reference voltage VR in accordance with the drive capability of the output buffer 10 that changes in accordance with the drive-capability switching control signal CDRV0 and/or the drive-capability switching control signal CDRV1.

The reference voltage VR is efficiently generated in accordance with a change in the drive capability of the output buffer 10.

In the semiconductor device and the method for controlling the semiconductor device according to the first embodiment illustrated in FIG. 1, the output buffer 10 outputs, on the basis of the output impedance of the output buffer 10 that has changed in accordance with the drive-capability switching control signal CDRV0 and/or the drive-capability switching control signal CDRV1, the voltage that changes in accordance with the level of the data signal A, namely, the voltage VE, to the node N1. The comparator COMP1 compares the voltage VE, which is output from the node N1, with the reference voltage VR, and outputs the comparison-result signal TX.

The magnitude relationship between the level of the voltage VE and the level of the reference voltage VR is determined on the basis of the comparison-result signal TX.

It is determined on the basis of the magnitude relationship between the level of the voltage VE and the level of the reference voltage VR whether the drive capability of the output buffer 10 has been switched to a given drive capability or not.

In the semiconductor device and the method for controlling the semiconductor device according to the first embodiment illustrated in FIG. 1, because the reference voltage VR is efficiently generated in accordance with a change in the drive capability of the output buffer 10, a time taken to determine the magnitude relationship between the level of the voltage VE and the level of the reference voltage VR is reduced.

A time taken to determine whether the drive capability of the output buffer 10 has been switched to a given drive capability or not is reduced by reducing the time taken to determine the above-mentioned magnitude relationship.

A cost for a DC test, which is proportional to the time taken to determine whether the drive capability of the output buffer 10 has been switched to a given drive capability or not, is reduced.

In the semiconductor device and the method for controlling the semiconductor device according to the first embodiment illustrated in FIG. 1, the level of the voltage VE, which is output from the node N1, changes in proportion to a voltage obtained by dividing a voltage corresponding to the logic level of the data signal A by the output impedance of the output buffer 10 and the resistance of the terminating resistor R1.

When the output impedance of the output buffer 10 changes by switching between the drive capabilities of the output buffer 10, a division ratio used to divide a voltage corresponding to the logic level of the data signal A changes.

The level of the voltage VE changes in accordance with a change in the division ratio.

A change in the drive capability of the output buffer 10 which influences the division ratio is transformed into a change in the level of the voltage VE.

In the semiconductor device and the method for controlling the semiconductor device according to the first embodiment illustrated in FIG. 1, the voltage VE, which changes in accordance with the difference in the drive capability of the output buffer 10, is applied to the non-inverting input terminal of the comparator COMP1. The reference voltage VR, the voltage value of which changes in accordance with the drive capability of the output buffer 10, is applied to the inverting input terminal of the comparator COMP1.

When the drive capability of the output buffer 10 is switched, the comparison result of the comparator COMP1 changes because each of the voltage value of the voltage VE and the voltage of the reference voltage VR changes.

It is determined on the basis of the comparison-result signal TX of the comparator COMP1 whether or not the drive capability of the output buffer 10 has been switched to a given drive capability.

In the semiconductor device and the method for controlling the semiconductor device according to the first embodiment illustrated in FIG. 1, an output of the output buffer 10 and one end of the terminating resistor R1 are coupled in series via the external output terminal P1. The other end of the terminating resistor R1 is coupled to the ground via the power supply 30.

By using the terminating resistor R1, which is coupled to the output of the output buffer 10 in series, a voltage corresponding to the level of the data signal A that is input to the output buffer 10 is divided on the basis of a division ratio that is determined by the output impedance of the output buffer 10 and the resistance of the terminating resistor R1.

In the semiconductor device and the method for controlling the semiconductor device according to the first embodiment illustrated in FIG. 1, the voltage producing circuit 21B generates divided voltages having different voltage values in accordance with the combinations of the drive-capability switching control signals CDRV0 and CDRV1.

When the drive capability of the output buffer 10 is switched in accordance with the combinations of the drive-capability switching control signals CDRV0 and CDRV1, the voltage value of the divided voltage automatically changes in association with the switching of the drive capability.

Even when the drive capability of the output buffer 10 is switched, the voltage value of the divided voltage efficiently changes.

In the semiconductor device and the method for controlling the semiconductor device according to the first embodiment illustrated in FIG. 1, the produced-voltage selection circuit 21C selects a divided voltage that is to serve as the reference voltage VR from among the divided voltages having different voltage values in accordance with the difference in the level (a high level or a low level) of the data signal A.

The divided voltages having different voltage values may be selected in accordance with the difference in the level of the data signal A.

An appropriate divided voltage is selected as the reference voltage VR in association with the difference in the level of the data signal A.

In the semiconductor device and the method for controlling the semiconductor device according to the first embodiment illustrated in FIG. 1, the switch control signal having a high level is output from the generated-voltage control-signal producing circuit 21A in accordance with the drive-capability switching control signals CDRV0 and CDRV1. A switch coupled between one of the first to fourth voltage-dividing resistors having different division ratios and the power-supply voltage VCC is controlled by the switch control signal having a high level so that the switch is set to be in a closed state. Additionally, a switch coupled between the voltage-dividing resistor and the ground is controlled by the switch control signal having a high level so that the switch is set to be in a closed state.

When the switches are controlled so that they are set to be in the closed states, a divided voltage is generated by dividing the power-supply voltage VCC on the basis of a division ratio of the voltage-dividing resistor that is coupled to the switches which are in the closed states.

When different switches are selected as switches that are controlled by the switch control signal so that they are set to be in closed states, divided voltages having different voltage values are generated on the basis of the division ratios of the voltage-dividing resistors that are coupled to the switches in the closed states.

In the semiconductor device and the method for controlling the semiconductor device according to the first embodiment illustrated in FIG. 1, a time constant determined by each of the voltage-dividing resistors and parasitic capacitances that are coupled to the voltage-dividing resistor is set so that a time taken to cause the value of the reference voltage VR to reach the target value is shorter than the test cycle time.

By appropriately setting the time constant, the time taken to cause the value of the reference voltage VR to reach the target voltage value may be adjusted to the test cycle time.

Even when the test cycle time is reduced in order to reduce a target measurement time taken to measure drive capabilities of the output buffer 10, the time taken to cause the value of the reference voltage VR to reach the target voltage value is appropriately adjusted by changing the setting of the time constant.

A second embodiment will be described with reference to FIGS. 4 and 5. Here, components identical to those provided in the first embodiment illustrated in FIG. 1 are designated by the same reference symbols, and the description thereof is omitted.

Figure 4:
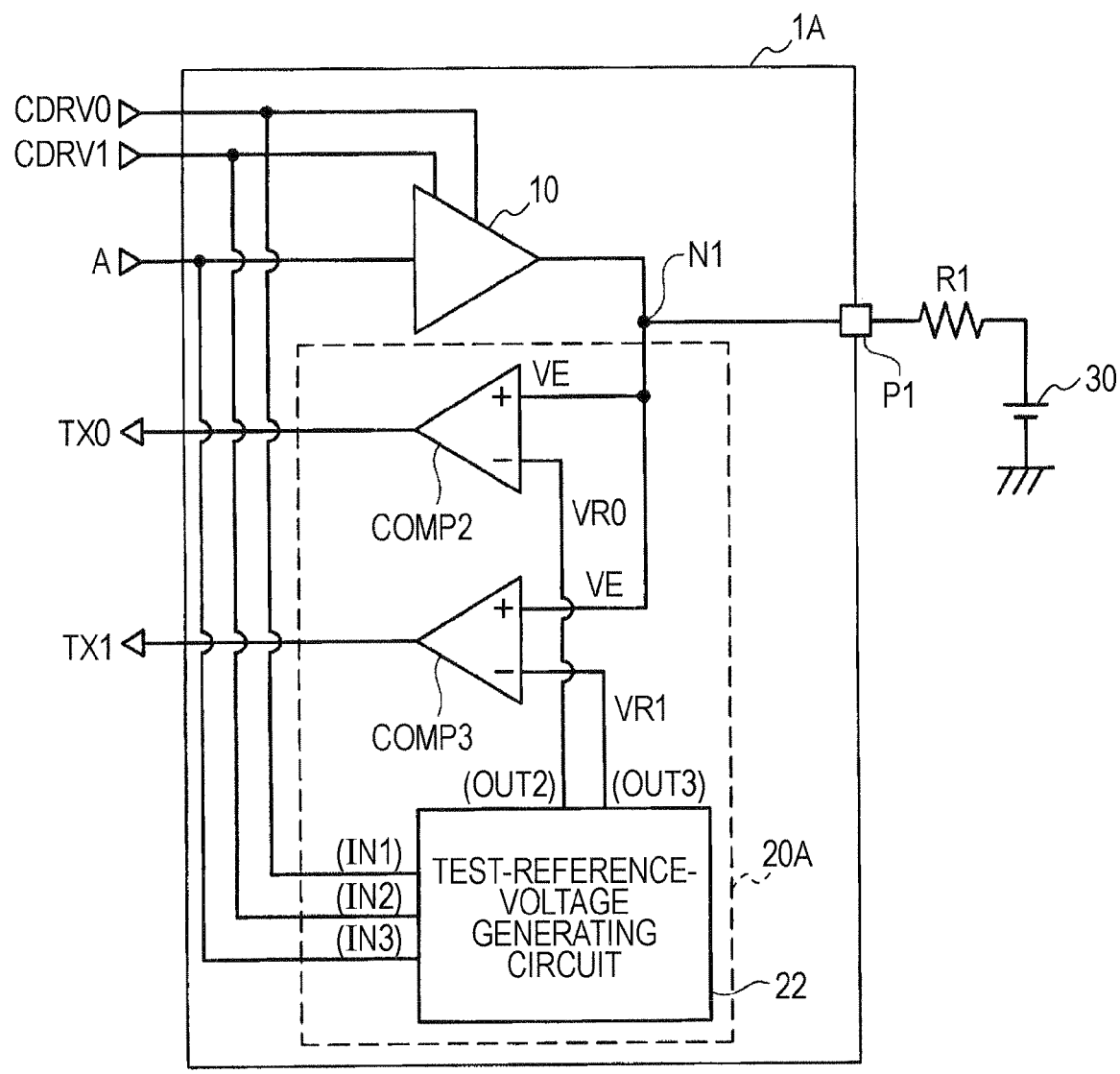
FIG. 4 illustrates a second embodiment.

FIG. 4 is a circuit block diagram of a semiconductor device 1A according to the second embodiment. The semiconductor device 1A includes the output buffer 10 and a drive-capability test circuit 20A.

The drive-capability test circuit 20A includes a comparator COMP2, a comparator COMP3, and a test-reference voltage generating circuit 22.

A non-inverting input terminal of the comparator COMP2, and a non-inverting input terminal of the comparator COMP3 are commonly coupled to the node N1.

Figure 5:
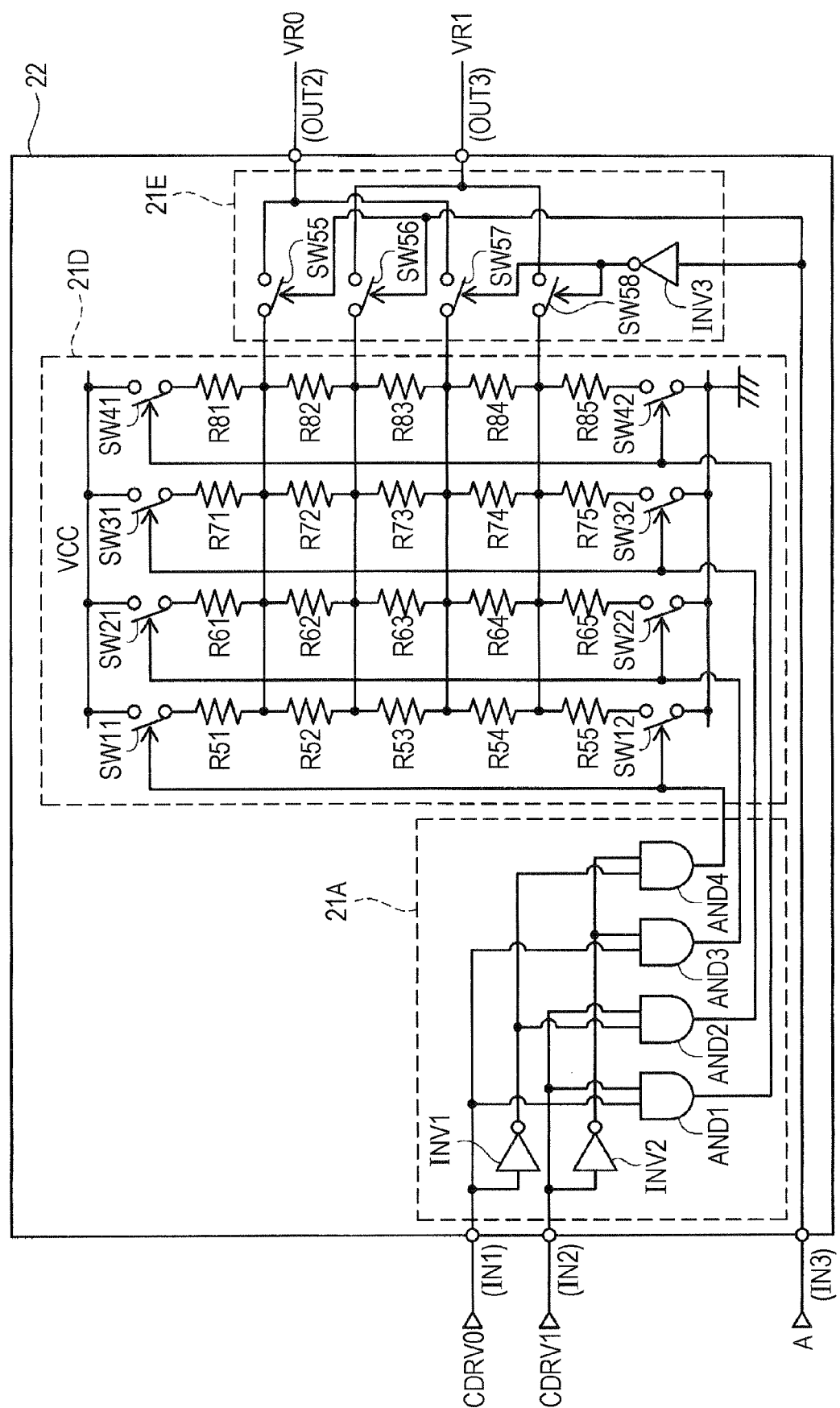
FIG. 5 illustrates a test-reference voltage generating circuit in the second embodiment illustrated in FIG. 4.

As illustrated in FIG. 5, the test-reference voltage generating circuit 22, which is also illustrated in FIG. 4, includes a voltage producing circuit 21D and a produced-voltage selection circuit 21E, which is different from the test-reference voltage generating circuit 21 illustrated in FIG. 2 in the first embodiment.

The voltage producing circuit 21D includes fifth to eighth voltage-dividing resistors. Different division ratios are set in each of the fifth to eighth voltage-dividing resistors.

Resistors R51, R52, R53, R54, and R55 are included in the fifth voltage-dividing resistor. Resistors R61, R62, R63, R64, and R65 are included in the sixth voltage-dividing resistor. Resistors R71, R72, R73, R74, and R75 are included in the seventh voltage-dividing resistor. Resistors R81, R82, R83, R84, and R85 are included in the eighth voltage-dividing resistor.

The fifth voltage-dividing resistor includes the resistors R51 to R55, which are coupled in series. One end of the resistor R51 is coupled to the power-supply voltage VCC via the switch SW11. One end of the resistor R55 is coupled to the ground via the switch SW12.

The sixth voltage-dividing resistor includes the resistors R61 to R65, which are coupled in series. One end of the resistor R61 is coupled to the power-supply voltage VCC via the switch SW21. One end of the resistor R65 is coupled to the ground via the switch SW22.

The seventh voltage-dividing resistor includes the resistors R71 to R75, which are coupled in series. One end of the resistor R71 is coupled to the power-supply voltage VCC via the switch SW31. One end of the resistor R75 is coupled to the ground via the switch SW32.

The eighth voltage-dividing resistor includes the resistors R81 to R85, which are coupled in series. One end of the resistor R81 is coupled to the power-supply voltage VCC via the switch SW41. One end of the resistor R85 is coupled to the ground via the switch SW42.

As illustrated in FIG. 5, the produced-voltage selection circuit 21E includes selection switches SW55 to SW58, and the inverter INV3. One end of the selection switch SW55 is coupled to a coupling point between the resistors R51 and R52, a coupling point between the resistors R61 and R62, a coupling point between the resistors R71 and R72, and a coupling point between the resistors R81 and R82.

The other end of the selection switch SW55 is coupled to an inverting input terminal of the comparator COMP2 illustrated in FIG. 4 via an output terminal (OUT2). A third signal input terminal (IN3) of the test-reference voltage generating circuit 22 is coupled to the selection switch SW55.

One end of the selection switch SW56 is coupled to a coupling point between the resistors R52 and R53, a coupling point between the resistors R62 and R63, a coupling point between the resistors R72 and R73, and a coupling point between the resistors R82 and R83.

The other end of the selection switch SW56 is coupled to an inverting input terminal of the comparator COMP3 illustrated in FIG. 4 via an output terminal (OUT3). The third signal input terminal (IN3) of the test-reference voltage generating circuit 22 is coupled to the selection switch SW56.

One end of the selection switch SW57 is coupled to a coupling point between the resistors R53 and R54, a coupling point between the resistors R63 and R64, a coupling point between the resistors R73 and R74, and a coupling point between the resistors R83 and R84.

The other end of the selection switch SW57 is coupled to the inverting input terminal of the comparator COMP2 illustrated in FIG. 4 via the output terminal (OUT2).

One end of the selection switch SW58 is coupled to a coupling point between the resistors R54 and R55, a coupling point between the resistors R64 and R65, a coupling point between the resistors R74 and R75, and a coupling point between the resistors R84 and R85.

The other end of the selection switch SW58 is coupled to the inverting input terminal of the comparator COMP3 illustrated in FIG. 4 via the output terminal (OUT3).

The inverter INV3 is coupled between the third signal input terminal (IN3) and the selection switch SW57, and coupled between the third signal input terminal (IN3) and the selection switch SW58.

Operation of a DC test performed in the semiconductor device 1A according to the second embodiment will be described. When the levels of the drive-capability switching control signals CDRV0 and CDRV1 are low, the switches SW11 and SW2 are controlled so that they are set to be in the closed states as in the case of the first embodiment.

When the level of the data signal A is high, the selection switches SW55 and SW56 are controlled by the data signal A so that they are set to be in closed states.

When the selection switch SW55 is in the closed state, the test-reference voltage generating circuit 22 outputs an upper-limit reference voltage VR0 from the output terminal (OUT2) via the selection switch SW55.

The upper-limit reference voltage VR0 is applied to the inverting input terminal of the comparator COMP2 illustrated in FIG. 4. The value of the upper-limit reference voltage VR0 is set to a value that is determined by the following equation. The value of the upper-limit reference voltage VR0 is set as an allowable upper limit value of the voltage VE.

Where $1/RC1=1/R52+1/R62+1/R72+1/R82$, $1/RC2=1/R53+1/R63+1/R73+1/R83$, and $1/RC3=1/R54+1/R64+1/R74+1/R84$, $$VR0 = VCC \times \text{a division ratio} \qquad (9)$$
$$= VCC \times \left\{ \frac{(RC1+RC2+RC3+R55)/}{(R51+RC1+RC2+RC3+R55)} \right\}$$

When the selection switch SW56 is in the closed state, the test-reference voltage generating circuit 22 outputs a lower-limit reference voltage VR1 from the output terminal (OUT3) via the selection switch SW56. The lower-limit reference voltage VR1 is applied to the inverting input terminal of the comparator COMP3 illustrated in FIG. 4. The value of the lower-limit reference voltage VR1 is set to a value that is determined by the following equation. The value of the lower-limit reference voltage VR1 is set as an allowable lower limit value of the voltage VE.

Where $1/RC1=1/R52+1/R62+1/R72+1/R82$, $1/RC2=1/R53+1/R63+1/R73+1/R83$, and $1/RC3=1/R54+1/R64+1/R74+1/R84$, $$VR1 = VCC \times \text{a division ratio} \qquad (10)$$
$$= VCC \times \left\{ \frac{(RC2+RC3+R55)/}{(R51+RC2+RC3+RC4+R55)} \right\}$$

According to the above-mentioned equations, the division ratio used to generate the upper-limit reference voltage VR0 is higher than that used to generate the lower-limit reference voltage VR1. Thus, the value of the upper-limit reference voltage VR0 is higher than that of the lower-limit reference voltage VR1.

As further illustrated in FIG. 4, the comparator COMP2 outputs a comparison-result signal TX0 indicating the comparison result between the voltage VE and the upper-limit reference voltage VR0. The comparator COMP2 determines, on the basis of the level of the comparison-result signal TX0, whether or not the value of the voltage VE is lower than the value of the upper-limit reference voltage VR0.

The comparator COMP3 outputs a comparison-result signal TX1 indicating the comparison result between the voltage VE and the lower-limit reference voltage VR1. The comparator COMP3 determines, on the basis of the level of the comparison-result signal TX1, whether or not the value of the voltage VE is higher than the value of the lower-limit reference voltage VR1.

In contrast, when the level of the data signal A is low, the level of the data signal A is inverted by the inverter INV3. The selection switches SW57 and SW58 are controlled by the data signal A so that they are set to be in closed states.

When the selection switch SW57 is in the closed state, the test-reference voltage generating circuit 22 outputs the upper-limit reference voltage VR0 from the output terminal (OUT2) via the selection switch SW57. The value of the upper-limit reference voltage VR0 is set to a value that is determined by the following equation:

Where $1/RC1=1/R52+1/R62+1/R72+1/R82$, $1/RC2=1/R53+1/R63+1/R73+1R/83$, and $1/RC3=1/R54+1/R64+1/R74+1/R84$, $$VR0 = VCC \times \text{a division ratio} \qquad (11)$$
$$= VCC \times \left\{ \frac{(RC3+R55)/}{(R51+RC1+RC2+RC3+R55)} \right\}$$

When the selection switch SW58 is in the closed state, the test-reference voltage generating circuit 22 outputs the lower-limit reference voltage VR1 from the output terminal (OUT3) via the selection switch SW58. The value of lower-limit reference voltage VR1 is set to a value that is determined by the following equation:

Where $1/RC1=1/R52+1/R62+1/R72+1/R82$, $1/RC2=1/R53+1/R63+1/R73+1/R83$, and $1/RC3=1/R54+1/R64+1/R74+1/R84$, $$VR1 = VCC \times \text{a division ratio} \qquad (12)$$
$$= VCC \times \{R55/(R51+RC1+RC2+RC3+R55)\}$$

As described above, when the level of the data signal A is high, in order that the test-reference voltage generating circuit 22 illustrated in FIG. 5 outputs the upper-limit reference voltage VR0, the division ratio of the fifth voltage-dividing resistor is set to RC1+RC2+RC3+R55.

In contrast, when the level of the data signal A is low, in order that the test-reference voltage generating circuit 22 outputs the upper-limit reference voltage VR0, the division ratio of the fifth voltage-dividing resistor is set to RC3+R55.

In order that the test-reference voltage generating circuit 22 outputs the upper-limit reference voltage VR0, the division ratio of the fifth voltage-dividing resistor is set so that a division ratio of the fifth voltage-dividing resistor in a case in which the level of the data signal A is high is higher than a division ratio of the fifth voltage-dividing resistor in a case in which the level of the data signal A is low. For this reason, the value of the upper-limit reference voltage VR0 is proportional to the division ratio of the fifth voltage-dividing resistor, and a value of the upper-limit reference voltage VR0 in a case in which the level of the data signal A is high is higher than a value of the upper-limit reference voltage VR0 in a case in which the level of the data signal A is low.

As shown in FIG. 5, as described above, when the level of the data signal A is high, in order that the test-reference voltage generating circuit 22 outputs the lower-limit reference voltage VR1, the division ratio of the fifth voltage-dividing resistor is set to RC2+RC3+R55.

In contrast, when the level of the data signal A is low, in order that the test-reference voltage generating circuit 22 outputs the lower-limit reference voltage VR1, the division ratio of the fifth voltage-dividing resistor is set to R55.

In order that the test-reference voltage generating circuit 22 outputs the lower-limit reference voltage VR1, the division ratio of the fifth voltage-dividing resistor is set so that a division ratio of the fifth voltage-dividing resistor in a case in which the level of the data signal A is high is higher than a division ratio of the fifth voltage-dividing resistor in a case in which the level of the data signal A is low. For this reason, the value of the lower-limit reference voltage VR1 is proportional to the division ratio of the fifth voltage-dividing resistor, and a value of the lower-limit reference voltage VR1 in a case in which the level of the data signal A is high is higher than a value of the lower-limit reference voltage VR1 in a case in which the level of the data signal A is low.

In the test-reference voltage generating circuit 22, one of the fifth to eighth voltage-dividing resistors is selected in accordance with one of the combinations of the levels of the drive-capability switching control signals CDRV0 and CDRV1 as in the case of the first embodiment.

In the test-reference voltage generating circuit 22, the selection switches SW55 and SW56 and the selection switches SW57 and SW58 are controlled so that either the pair of selection switches SW55 and SW56, or the pair of selection switches SW57 and SW58 is set to the closed states in accordance with the difference in the level of the data signal A.

The test-reference voltage generating circuit 22 outputs the upper-limit reference voltage VR0 and the lower-limit reference voltage VR1 in accordance with a combination of a selected voltage-dividing resistor and a pair of selection switches that are controlled so that the switches are set to be in the closed states as described above.

In the second embodiment, the comparator COMP2, which compares the voltage VE with the upper-limit reference voltage VR0, may correspond to, for example, a first comparing unit. The comparator COMP3, which compares the voltage VE to lower-limit reference voltage VR1, may correspond to, for example, a second comparing unit.

When the level of the data signal A is high, a divided voltage that is generated using one of the fifth to eighth voltage-dividing resistors is selected by the selection switch SW55 as the upper-limit reference voltage VR0.

When the level of the data signal A is low, a divided voltage that is generated using one of the fifth to eighth voltage-dividing resistors is selected by the selection switch SW57 as the upper-limit reference voltage VR0.

Each of the selection switches SW55 and SW57, which selects a divided voltage to serve as the upper-limit reference voltage VR0, may correspond to, for example, an upper-limit reference voltage selection part.

When the level of the data signal A is high, a divided voltage that is generated using one of the fifth to eighth voltage-dividing resistors is selected by the selection switch SW56 as the lower-limit reference voltage VR1.

When the level of the data signal A is low, a divided voltage that is generated using one of the fifth to eighth voltage-dividing resistors is selected by the selection switch SW58 as the lower-limit reference voltage VR1.

Each of the selection switches SW56 and SW58, which selects a divided voltage that is to serve as the lower-limit reference voltage VR1, may correspond to, for example, a lower-limit reference voltage selection part.

In the semiconductor device 1A according to the second embodiment illustrated in FIG. 4, the value of the voltage VE is compared to the value of the upper-limit reference voltage VR0 by the comparator COMP2.

It is determined on the basis of the comparison result of the comparator COMP2 whether or not the value of the voltage VE is lower than the value of the upper-limit reference voltage VR0.

The value of the voltage VE is compared to the value of the lower-limit reference voltage VR1 by the comparator COMP3.

It is determined on the basis of the comparison result of the comparator COMP3 whether or not the value of the voltage VE is higher than the value of the lower-limit reference voltage VR1.

As described above, the value of the voltage VE is compared to the value of the upper-limit reference voltage VR0 by the comparator COMP2, and the value of the voltage VE is compared to the value of the lower-limit reference voltage VR1 by the comparator COMP3. It is checked on the basis of the comparison result of the comparator COMP2 and the comparison result of the comparator COMP3 whether or not the value of the voltage VE is a value that exists in an allowable range of the upper-limit reference voltage VR0 to the lower-limit reference voltage VR1.

In the semiconductor device 1A according to the second embodiment illustrated in FIG. 4, in accordance with the data signal A having a high level, a divided voltage that is generated on the basis of a division ratio of one of the fifth to eighth voltage-dividing resistors is output as the upper-limit reference voltage VR0 via the selection switch SW55 that is in the closed state. Furthermore, in accordance with the data signal A having a low level, a divided voltage that is generated on the basis of a division ratio of one of the fifth to eighth voltage-dividing resistors is output as the upper-limit reference voltage VR0 via the selection switch SW57 that is in the closed state.

In accordance with the data signal A having a high level, a divided voltage is output as the lower-limit reference voltage VR1 via the selection switch SW56 that is in the closed state. In such a case, the divided voltage that is output as the lower-limit reference voltage VR1 is generated on the basis of a division ratio that is lower than the division ratio which is set in one of the voltage-dividing resistors in a case in which the upper-limit reference voltage VR0 is generated when the selection switch SW55 is in the closed state. Furthermore, in accordance with the data signal A having a low level, a divided voltage is output as the lower-limit reference voltage VR1 via the selection switch SW58 that is in the closed state. In such a case, the divided voltage that is output as the lower-limit reference voltage VR1 is generated on the basis of a division ratio that is lower than the division ratio which is set in one of the voltage-dividing resistors in a case in which the upper-limit reference voltage VR0 is generated when the selection switch SW57 is in the closed state.

A divided voltage generated on the basis of a division ratio that is lower than a division ratio used to generate the upper-limit reference voltage VR0 is output as the lower-limit reference voltage VR1 via the selection switch SW56 or SW58.

Since a divided voltage generated on the basis of a division ratio that is lower than a division ratio used to generate the upper-limit reference voltage VR0 is output as the lower-limit reference voltage VR1, the value of the lower-limit reference voltage VR1 is set to a value that is lower than that of the upper-limit reference voltage VR0.

A third embodiment will be described with reference to FIG. 6. Here, components identical to those that are provided in the first embodiment illustrated in FIG. 1 and in the second embodiment illustrated in FIG. 4 are designated by the same reference symbols, and the description thereof is omitted.

Figure 6:
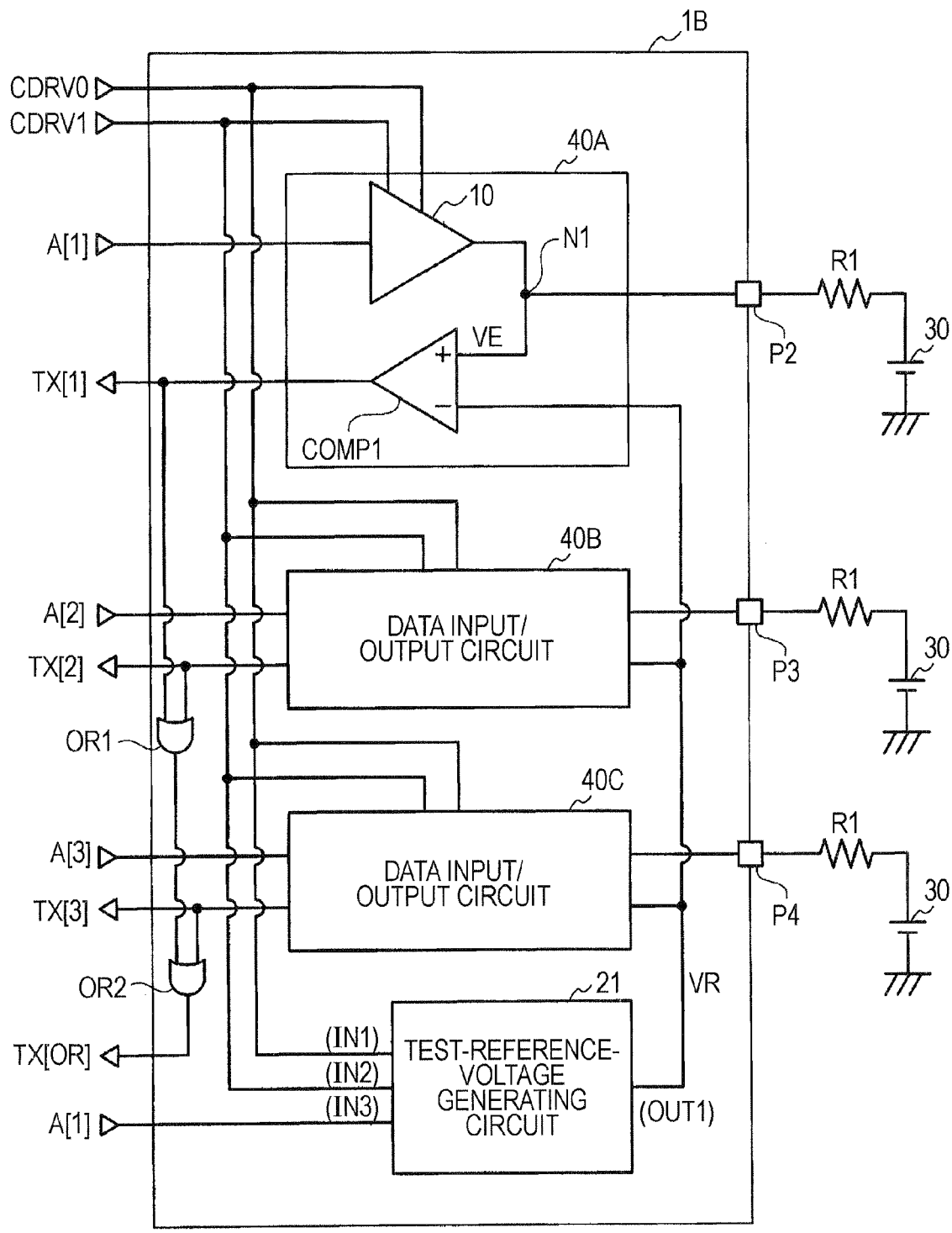
FIG. 6 illustrates a third embodiment.

FIG. 6 is a circuit block diagram of a semiconductor device 1B according to the third embodiment. The semiconductor device 1B includes input/output circuits 40 and the same test-reference voltage generating circuit 21 illustrated in FIG. 1.

The semiconductor device 1B includes a plurality of data input/output circuits 40. Here, the semiconductor device 1B that includes the three data input/output circuits 40A to 40C is illustrated in FIG. 6 as an example. Each of the data input/output circuits 40A to 40C includes the same output buffer 10 illustrated in FIG. 1 and the comparator COMP1.

An inverting input terminal of the comparator COMP1 included in each of the data input/output circuits 40A to 40C is coupled to the output terminal (OUT1) of the test-reference voltage generating circuit 21. Reference numerals P2 to P4 illustrated in FIG. 6 denote external output terminals.

A first input of a first OR gate circuit OR1 is coupled to an output of the comparator COMP1 included in the data input/output circuit 40A. A second input of the first OR gate circuit OR1 is coupled to an output of the comparator COMP1 (not illustrated) included in the data input/output circuit 40B.

A first input of a second OR gate circuit OR2 is coupled to an output of the first OR gate circuit OR1. A second input of the second OR gate circuit OR2 is coupled to an output of the comparator COMP1 (not illustrated) included in the data input/output circuit 40C.

Operation of a DC test performed in the semiconductor device 1B according to the third embodiment illustrated in FIG. 6 will be described.

As illustrated in FIG. 6, in the semiconductor device 1B, the drive-capability switching control signals CDRV0 and CDRV1 are input to each of the comparators COMP1 included in the data input/output circuits 40A to 40C.

Each of data signals A[1] to A[3] is input to the output buffers 10 included in each of the data input/output circuits 40A to 40C. The same low levels or high levels are set as the levels of the data signals A[1] to A[3].

One of the data signals A[1] to A[3] is input to the test-reference voltage generating circuit 21 via the third signal input terminal (IN3). Here, the data signal A[1] is input to the test-reference voltage generating circuit 21.

As in the case of the first embodiment illustrated in FIG. 1, the test-reference voltage generating circuit 21 outputs the reference voltage VR in accordance with one of the first to fourth voltage-dividing resistors in combination with either of the selection switches SW51 and SW52. The reference voltage VR is applied to each of the inverting input terminals of the comparators COMP1 included in the data input/output circuits 40A to 40C.

Each of the comparators COMP1 outputs comparison-result signals TX[1] to TX[3] indicating the corresponding comparison results between corresponding voltages VE and the reference voltage VR.

The comparison-result signals TX[1] and TX[2] having the similar levels (low levels) are input to the inputs of the first OR gate circuit OR1. A signal indicating an OR result of the first OR gate circuit OR1 is input to the first input of the second OR gate circuit OR2.

The comparison-result signal TX[3] having a level (a low level) the same as that of the signal indicating the OR result is input into the second input of the second OR gate circuit OR2. The level of a signal TX[OR] indicating an OR result of the second OR gate circuit OR2 is the same as that of each of the signals which are input to the first and second inputs of the second OR gate circuit OR2.

In the semiconductor device 1B, checking the level (low level) of the signal TX[OR] determines whether or not the drive capabilities of the output buffers 10 of the data input/output circuits 40A to 40C have been switched to the same drive capabilities.

In the semiconductor device 1B according to the third embodiment illustrated in FIG. 6, the output terminal (OUT1) of the test-reference voltage generating circuit 21 is coupled to each of the inverting input terminals of the comparators COMP1 included in the data input/output circuit 40A to 40C.

The comparators COMP1 included in the data input/output circuits 40A to 40C do not require test-reference voltage generating circuits dedicated to the individual comparators COMP1.

The size of an area occupied by the test-reference voltage generating circuit is reduced compared to that of an area occupied by the test-reference voltage generating circuits dedicated to the individual comparators COMP1.

An increase in area occupied by the semiconductor device 1B that includes the three data input/output circuits 40A to 40C is reduced by reducing the size of the area occupied by the test-reference voltage generating circuit.

A fourth embodiment will be described with reference to FIGS. 7 and 8. Here, components identical to those that are provided in the first embodiment illustrated in FIG. 1, in the second embodiment illustrated in FIG. 4, and in the third embodiment illustrated in FIG. 6 are designated by the same reference symbols, and the description thereof is omitted.

Figure 7:
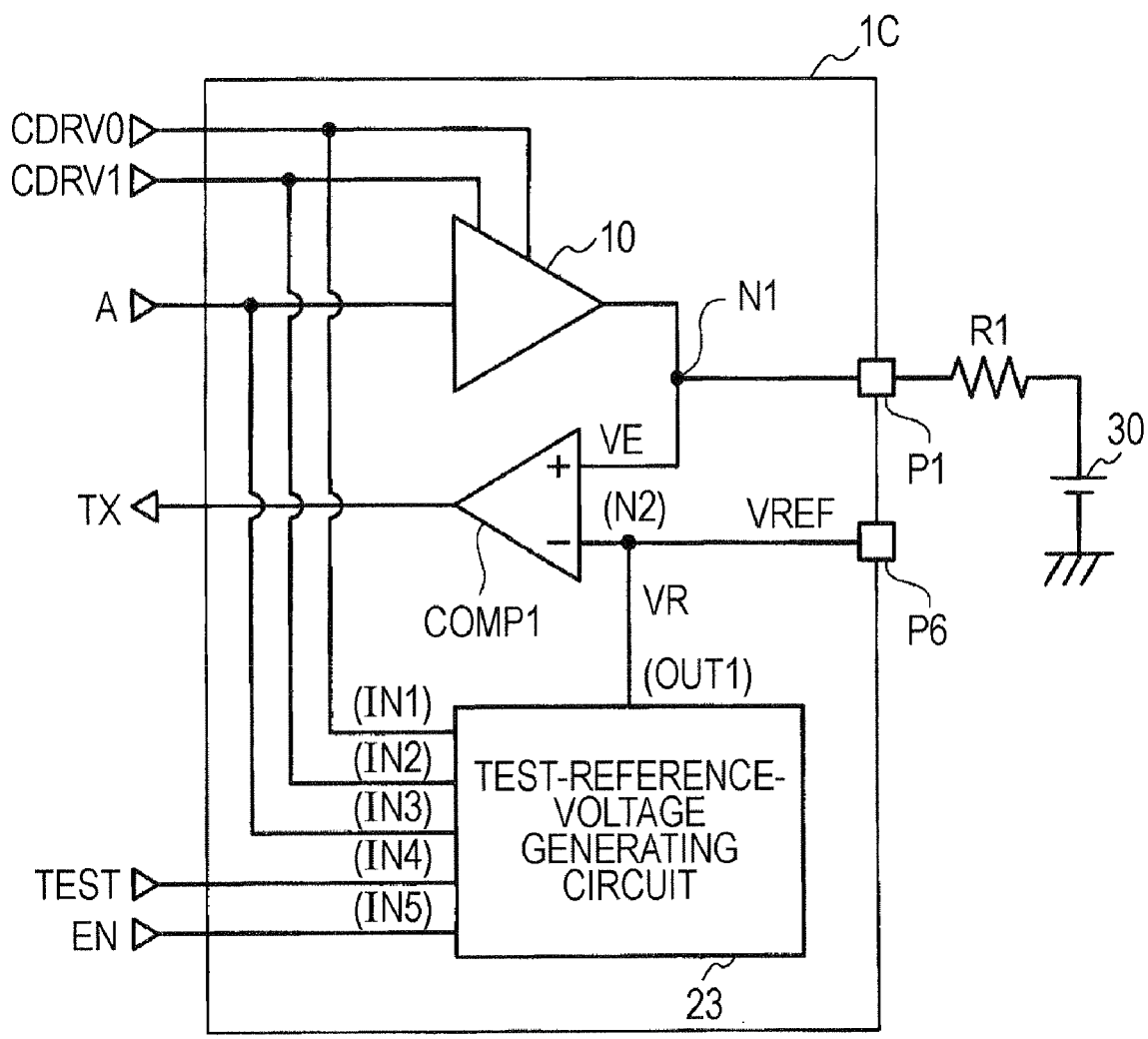
FIG. 7 illustrates a fourth embodiment.

FIG. 7 is a circuit block diagram of a semiconductor device 1C according to the fourth embodiment. The semiconductor device 1C includes the output buffer 10, the comparator COMP1, and a test-reference voltage generating circuit 23.

Figure 8:
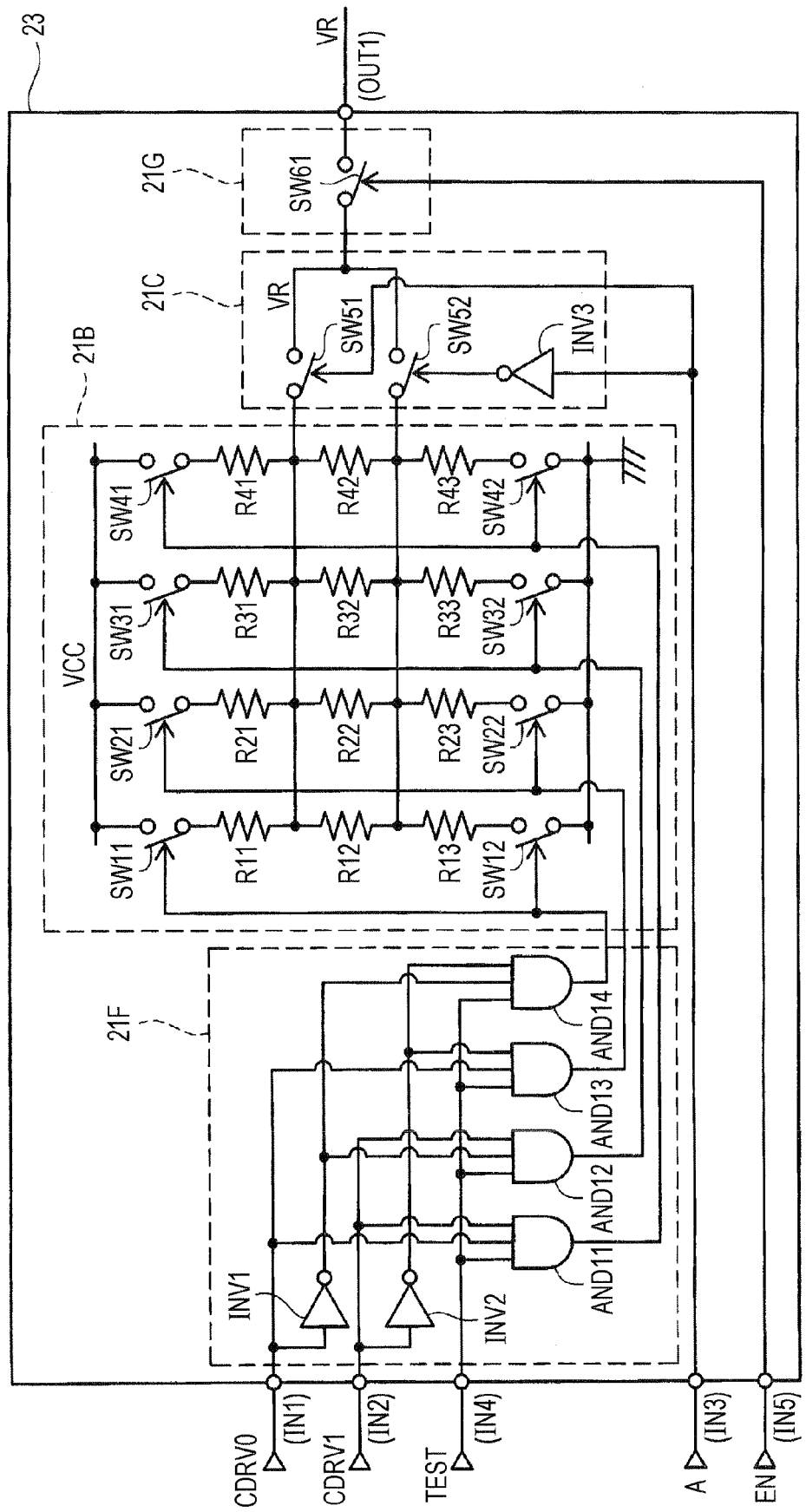
FIG. 8 illustrates a test-reference voltage generating circuit in the fourth embodiment illustrated in FIG. 7.

As illustrated in FIG. 8, the test-reference voltage generating circuit 23 includes a generated-voltage control-signal producing circuit 21F, the voltage producing circuit 21B, the produced-voltage selection circuit 21C, and a voltage output control circuit 21G.

The generated-voltage control-signal producing circuit 21F includes three-input AND gate circuits AND11 to AND14 instead of the first AND gate circuit AND1 to the fourth AND gate circuit AND4 that are included in the generated-voltage control-signal producing circuit 21A in the first embodiment illustrated in FIG. 1.

A first input of the three-input AND gate circuit AND11 is coupled to a fourth signal input terminal (IN4) of the test-reference voltage generating circuit 23. A second input of the three-input AND gate circuit AND11 is coupled to a first signal input terminal (IN1) of the test-reference voltage generating circuit 23. A third input of the three-input AND gate circuit AND11 is coupled to a second signal input terminal (IN2) of the test-reference voltage generating circuit 23.

A first input of the three-input AND gate circuit AND12 is coupled to the fourth signal input terminal (IN4). A second input of the three-input AND gate circuit AND12 is coupled to the first signal input terminal (IN1) via the inverter INV1. A third input of the three-input AND gate circuit AND12 is coupled to the second signal input terminal (IN2).

A first input of the three-input AND gate circuit AND13 is coupled to the fourth signal input terminal (IN4). A second input of the three-input AND gate circuit AND13 is coupled to the first signal input terminal (IN1). A third input of the three-input AND gate circuit AND13 is coupled to the second signal input terminal (IN2) via the inverter INV2.

A first input of the three-input AND gate circuit AND14 is coupled to the fourth signal input terminal (IN4). A second input of the three-input AND gate circuit AND14 is coupled to the first signal input terminal (IN1) via the inverter INV1. A third input of the three-input AND gate circuit AND14 is coupled to the second signal input terminal (IN2) via the inverter INV2.

The voltage output control circuit 21G includes a DC-test switch SW61. One end of the DC-test switch SW61 is coupled to the selection switches SW51 and SW52. The other end of the DC-test switch SW61 is coupled to the inverting input terminal of the comparator COMP1 via an output terminal (OUT1).

In addition to the output terminal (OUT1), a voltage application terminal P6 is coupled to the inverting input terminal of the comparator COMP1. The DC-test switch SW61 is coupled to a fifth signal input terminal (IN5) of the test-reference voltage generating circuit 23.

Operation of a DC test performed in the semiconductor device 1C according to the fourth embodiment illustrated in FIG. 4 will be described. When it is to be determined whether or not the drive capability of the output buffer 10 has been switched to a given drive capability, a DC test signal TEST having a high level is input via the fourth signal input terminal (IN4) of the test-reference voltage generating circuit 23. The DC test signal TEST having a high level is input to the first inputs of the three-input AND gate circuits AND11 to AND14.

In the test-reference voltage generating circuit 23, one of the four three-input AND gate circuits AND11 to AND14 outputs the switch control signal having a high level in accordance with a change in the levels of the drive-capability switching control signal CDRV0 and/or the drive-capability switching control signal CDRV1 as in the case of the test-reference voltage generating circuit 21.

As shown in FIG. 8, in the test-reference voltage generating circuit 23, one of the first to fourth voltage-dividing resistors is selected by the switch control signal having a high level as in the case of the test-reference voltage generating circuit 21.

In the test-reference voltage generating circuit 23, the selection switches SW51 and SW52 are controlled so that either of the selection switches SW51 and SW52 is set to be in the closed state in accordance with the level of the data signal A as in the case of the test-reference voltage generating circuit 21.

In the test-reference voltage generating circuit 23, one of the first to fourth voltage-dividing resistors and either of the selection switches SW51 and SW52 are combined as in the case of the test-reference voltage generating circuit 21. The test-reference voltage generating circuit 23 outputs the reference voltage VR to the voltage output control circuit 21G in accordance with the combination.

An enable signal EN is input to the test-reference voltage generating circuit 23 via the fifth signal input terminal (IN5). When the level of the enable signal EN is high, the DC-test switch SW61 is controlled by the enable signal EN so that it is set to be in a closed state.

The test-reference voltage generating circuit 23 outputs the reference voltage VR from the output terminal (OUT1) via the DC-test switch SW61. Referring to FIG. 7, the reference voltage VR is applied to the inverting input terminal of the comparator COMP1.

When the level of the DC test signal TEST is low, none of the three-input AND gate circuits output a switch control signal having a high level. Thus, no divided voltage that is to serve as the reference voltage VR is generated. In this case, a reference voltage VREF is applied to the inverting input terminal of the comparator COMP1 via the voltage application terminal P6.

In the fourth embodiment illustrated in FIG. 7, a bidirectional input/output buffer may be configured using the output buffer 10 and the comparator COMP1.

In the fourth embodiment, when it is to be determined that the drive capability of the output buffer 10 has been switched to a given drive capability, the level of the DC test signal TEST is set to be high. The DC test signal TEST may correspond to, for example, a drive-capability measurement command signal.

One of the three-input AND gate circuits AND11 to AND14 outputs a result of AND of the DC test signal TEST and the drive-capability switching control signals CDRV0 and CDRV1 as the switch control signal having a high level. Each of the three-input AND gate circuits AND11 to AND14, which outputs the switch control signal having a high level, may correspond to, for example, an AND calculation circuit.

The DC-test switch SW61 is controlled by the enable signal EN so that it is set to be in the closed state. Accordingly, the reference voltage VR is applied to the inverting input terminal of the comparator COMP1 via the DC-test switch SW61. The enable signal EN, which controls the DC-test switch SW61 so that it is set to be in the closed state in order to cause the reference voltage VR to be applied to the inverting input terminal of the comparator COMP1, may correspond to, for example, an output control signal.

Application or non-application of the reference voltage VR to the inverting input terminal of the comparator COMP1 is performed by controlling the DC-test switch SW61 of the voltage output control circuit 21G so that the DC-test switch SW61 is set to be in the closed or open state. The voltage output control circuit 21G may correspond to, for example, a voltage output control section.

In the semiconductor device 1C according to the fourth embodiment illustrated in FIG. 7 and a method for controlling the semiconductor device 1C, one of the three-input AND gate circuits AND11 to AND14 outputs the result of AND of the DC test signal TEST and the drive-capability switching control signals CDRV0 and CDRV1 as the switch control signal having a high level. One switch coupled between one of the first to fourth voltage-dividing resistors and the power-supply voltage VCC is controlled by the switch control signal having a high level so that the switch is set to be in a closed state. In addition, one switch coupled between the one of the first to fourth voltage-dividing resistors and the ground is controlled by the switch control signal having a high level so that the switch is set to be in a closed state.

When the DC test signal TEST having a high level is not input to each of the three-input AND gate circuits AND11 to AND14, each of the three-input AND gate circuits AND11 to AND14 outputs an AND result as the switch control signal having a low level. The above-mentioned switches are controlled by the switch control signals having a low level so that they are set to be in open states.

When the above-mentioned switches are controlled so that they are set to be in the open states, the power-supply voltage VCC is not applied to any of the voltage-dividing resistors. Thus, no current flows through any of the voltage-dividing resistors.

In the semiconductor device 1C and the method for controlling the semiconductor device 1 C according to the fourth embodiment illustrated in FIG. 7, the DC-test switch SW61 is controlled in accordance with the level of the enable signal EN so that the DC-test switch SW61 is set to be in the closed or open state.

When the DC-test switch SW61 is controlled so that it is set to be in the closed or open state, application or non-application of the reference voltage VR to the inverting input terminal of the comparator COMP1 via the DC-test switch SW61 is controlled.

When the DC-test switch SW61 is controlled in accordance with the enable signal EN having a low level so that the DC-test switch SW61 is set to be in the open state, the reference voltage VR is not applied to the inverting input terminal of the comparator COMP1 via the DC-test switch SW61.

When various reference voltages VREF having different voltage values are applied to the inverting input terminal of the comparator COMP1 in a state in which the reference voltage VR is not applied to the inverting input terminal of the comparator COMP1, the level of the comparison-result signal TX changes.

The voltage value of the reference voltage VR is adjusted by checking a change in the level of the comparison-result signal TX so that the reference voltage VR has a voltage value the same as that of one of the reference voltages VREF, whereby the value of the reference voltage VR is adjusted to a given value.

In the semiconductor device 1C and the method for controlling the semiconductor device 1C according to the fourth embodiment illustrated in FIG. 7, a bidirectional input/output buffer may be configured using the output buffer 10 and the comparator COMP1. When the level of the DC test signal TEST is low, instead of the reference voltage VR, the reference voltage VREF is applied to the inverting input terminal of the comparator COMP1 via the voltage application terminal P6.

When a DC test for determining whether or not the drive capability of the output buffer 10 has been switched to a given drive capability is not to be performed (when the level of the DC test signal TEST is low), the comparator COMP1 may be used as an input circuit of the bidirectional input/output buffer.

Another comparator COMP1 is not necessarily provided separately from the input circuit of the bidirectional input/output buffer.

Thus, the size of an occupied area is reduced compared to that of an occupied area in a case in which another comparator COMP1 is provided separately from the input circuit of the bidirectional input/output buffer.

The present invention is not limited to the above-described embodiments. Various modifications of a portion of a configuration in any of the embodiments may be made without departing from the principles and spirit of the present invention. The test-reference voltage generating circuit 22 in the above-described second embodiment may be a test-reference voltage generating circuit provided with the generated-voltage control-signal producing circuit 21F instead of with the generated-voltage control-signal producing circuit 21A. With the test-reference voltage generating circuit provided with the generated-voltage control-signal producing circuit 21F, the power consumption is reduced as in the case of the fourth embodiment.

Furthermore, in the semiconductor device 1B in the third embodiment illustrated in FIG. 6, the first OR gate circuit OR1 may be embedded in the data input/output circuit 40B, and the second OR gate circuit OR2 may be embedded in the data input/output circuit 40C.

Additionally, in the semiconductor device 1C in the fourth embodiment illustrated in FIG. 7, an applied-voltage selection switch may be provided between the node N2 and the voltage application terminal P6. When the DC test is performed, the applied-voltage selection switch is controlled so that it is set to be in an open state. With this control performed for the applied-voltage selection switch, for example, even in a case in which the reference voltage VREF is always applied via the voltage application terminal P6, when the DC test is performed, the voltage application terminal P6 is not coupled to the inverting input terminal of the comparator COMP1. Accordingly, application of the reference voltage VREF to the inverting input terminal of the comparator COMP1 is suspended.

In the voltage producing circuit 21B in the first embodiment and the voltage producing circuit 21D in the second embodiment, a switch may be coupled to one end of each of the voltage-dividing resistors instead of the switches, which are controlled by the switch control signal having a high level so that they are set to be the closed states, being coupled to both ends of each of the voltage-dividing resistors. For example, when the switch SW11 is coupled between the resistor R11 included in the first voltage-dividing resistor and the power-supply voltage VCC, the switch SW12 (see FIG. 2) is not necessarily provided.

In the semiconductor device 1B in the third embodiment illustrated in FIG. 6, when the same high levels are set as the levels of the data signals A[1] to A[3], AND gate circuits may be used instead of the first OR gate circuits OR1 and the second OR gate circuit OR2.

According to any of the above-described embodiments, a reference voltage generating section generates a reference voltage in accordance with a signal for switching between drive capabilities and an input signal. The reference voltage generating section changes the value of the reference voltage in accordance with a change in drive capability. The reference voltage generating section efficiently generates the reference voltage in accordance with a change in drive capability.

According to any of the above-described embodiments, a circuit section transforms the input signal into an output signal for an output impedance in accordance with the output impedance that changes in accordance with the signal for switching between drive capabilities, and outputs the output signal. A comparing section compares the voltage of the output signal to the reference voltage, and outputs a comparison result. The magnitude relationship between the voltage of the output signal and the reference voltage is determined on the basis of the comparison result which is output from the comparing section. Whether or not the setting of a drive capability is appropriate is checked on the basis of the magnitude relationship between the voltage of the output signal and the reference voltage.

According to any of the above-described embodiments, because the reference voltage is efficiently generated in accordance with a change in drive capability, a time taken to determine the magnitude relationship between the voltage of the output signal and the reference voltage is reduced. A time taken to perform a check test on drive capabilities is reduced by reducing the time taken to determine the magnitude relationship between the voltage of the output signal and the reference voltage. Thus, costs of the check test on drive capabilities, which is proportional to the time taken to perform the check test, are reduced.

According to any of the above-described embodiments, a reference voltage generating operation involves generating a reference voltage that changes in accordance with a signal for switching between drive capabilities and an input signal. In the reference voltage-generating operation, the value of the reference voltage is changed in accordance with a change in drive capability. The reference voltage is efficiently generated in accordance with a change in drive capability.

According to any of the above-described embodiments, an output operation involves transforming the input signal into an output signal for an output impedance in accordance with the output impedance that changes in accordance with the signal for switching between drive capabilities, and outputting the output signal. A comparing operation involves comparing the voltage of the output signal to the reference voltage, and outputting a comparison result. The magnitude relationship between the voltage of the output signal and the reference voltage is determined on the basis of the comparison result which is output in the comparing operation. Whether or not the setting of a drive capability is appropriate is checked on the basis of the magnitude relationship between the voltage of the output signal and the reference voltage.

According to any of the above-described embodiments, because the reference voltage is efficiently generated in accordance with a change in drive capability, a time taken to determine the magnitude relationship between the voltage of the output signal and the reference voltage is reduced. A time taken to perform a check test on drive capabilities is reduced by reducing the time taken to determine the magnitude relationship between the voltage of the output signal and the reference voltage. Thus, costs of the check test on drive capabilities, which are proportional to the time taken to perform the check test, are reduced.

Although embodiments have been illustrated and described, it would be appreciated by those skilled in the art that changes might be made in these embodiments without departing from the principles and spirit of the invention, the scope of which is defined in the claims and their equivalents.

Numbers applying embodiments (first, second or third etc.) do not show priorities of the embodiments. Many variations and modifications will be apparent to those skilled in the art.

What is claimed is:

1. A semiconductor device comprising:
a circuit section having an output impedance which changes in accordance with a switching signal for switching between drive capabilities, and transforming an input signal into an output signal in accordance with the output impedance;
a reference voltage generating section generating a reference voltage in accordance with the switching signal and the input signal; and
a comparing section comparing a voltage of the output signal to the reference voltage.

2. The semiconductor device according to claim 1,
wherein the circuit section is able to be coupled to a resistor element via an output terminal from which the output signal is output, and
wherein a voltage of the output terminal is a divided voltage obtained by dividing a voltage corresponding to a level of the input signal by the output impedance and a resistance of the resistor element.

3. The semiconductor device according to claim 2,
wherein the comparing section comprises a comparator,
wherein the divided voltage is input to a first input terminal of the comparator, and the reference voltage is input to a second input terminal of the comparator.

4. The semiconductor device according to claim 2,
wherein the circuit section and the resistor element are able to be coupled in series via the output terminal.

5. The semiconductor device according to claim 1,
wherein the reference voltage generating section generates an upper-limit reference voltage corresponding to an upper-limit value of the reference voltage, and a lower-limit reference voltage corresponding to a lower-limit value of the reference voltage, and
wherein the comparing section comprises a first comparing unit that compares a voltage of an output terminal to the upper-limit reference voltage, and a second comparing unit that compares the voltage of the output terminal to the lower-limit reference voltage.

6. The semiconductor device according to claim 1,
wherein the circuit section comprises a plurality of circuit sections, and the comparing section comprises a plurality of comparing sections, and
wherein the reference voltage generating section is coupled to the plurality of comparing sections.

7. The semiconductor device according to claim 1,
wherein the reference voltage generating section comprises
a voltage-dividing unit that outputs a plurality of divided voltages having different voltage values by dividing a power-supply voltage in accordance with the switching signal, and
a voltage selection unit that selects a divided voltage, as the reference voltage, from the plurality of divided voltages in accordance with a logic level of the input signal.

8. The semiconductor device according to claim 7,
wherein the voltage-dividing unit comprises
a plurality of voltage-dividing resistors that are coupled between a high-potential power-supply voltage and a low-potential power-supply voltage, and that have a plurality of division ratios which are different for the plurality of individual voltage-dividing resistors,
a plurality of switching parts that are each coupled either between the high-potential power-supply voltage and a corresponding one of the plurality of voltage-dividing resistors, or between the low-potential power-supply voltage and a corresponding one of the plurality of voltage-dividing resistors, or that are coupled both between the high-potential power-supply voltage and the plurality of corresponding voltage-dividing resistors and between the low-potential power-supply voltage and the plurality of corresponding voltage-dividing resistors, and
a closure-signal producing part that outputs a closure signal in accordance with the switching signal, the closure signal being used to close at least one of the plurality of switching parts, the at least one of the plurality of switching parts being coupled to one of the plurality of voltage-dividing resistors.

9. The semiconductor device according to claim 8,
wherein a time constant of an integrating circuit having a resistance of the one of the plurality of voltage-dividing resistors and a parasitic capacitance coupled to the voltage-dividing resistor is set so that a time taken to cause a value of the selected divided voltage to reach a target voltage value is shorter than a test cycle time obtained by dividing a target measurement time taken to measure the drive capabilities by the number of cases in which the drive capabilities are tested.

10. The semiconductor device according to claim 9,
wherein the closure-signal producing part comprises an AND calculating circuit that outputs the closure signal on the basis of an AND operation of a drive-capability measurement command signal and the switching signal, the drive-capability measurement command signal being used to command a start of measurement of one of the drive capabilities.

11. The semiconductor device according to claim 10,
wherein, when the drive-capability measurement command signal is in a non-active state, a reference voltage that is to be compared to a voltage of an output terminal is supplied to an input/output buffer circuit having the circuit section and the comparing section.

12. The semiconductor device according to claim 8,
wherein the plurality of division ratios is set in the plurality of voltage-dividing resistors, and
wherein the voltage selection unit comprises
an upper-limit reference voltage selection part that selects, as an upper-limit reference voltage corresponding to an upper-limit value of the reference voltage, a divided voltage that is output on the basis of one of, or two or more of the plurality of division ratios, and a lower-limit reference voltage selection part that selects, as a lower-limit reference voltage corresponding to a lower-limit value of the reference voltage, a divided voltage that is output on the basis of one of, or two or more of the plurality of division ratios.

13. The semiconductor device according to claim 7, further comprising
a voltage output control section that selects, in accordance with an output control signal that is used to command permitting or prohibiting an output of the divided voltage selected by the voltage selection unit to the comparing section, either permitting the output of the divided voltage to the comparing section or prohibiting the output of the divided voltage to the comparing section.

14. A method for controlling a semiconductor device, the method comprising:
changing an output impedance in accordance with a switching signal for switching between drive capabilities;
transforming an input signal into an output signal in accordance with the output impedance;
generating a reference voltage changing in accordance with the switching signal and the input signal; and
comparing a voltage of the output signal to the reference voltage.

15. The method according to claim 14,
wherein a voltage of an output terminal is a divided voltage obtained by dividing a voltage corresponding to a level of the input signal by the output impedance and a resistance of the resistor element that is able to be coupled to the output impedance.

16. The method according to claim 15,
wherein the divided voltage is compared to the reference voltage.

17. The method according to claim 14,
wherein, when the reference voltage is generated,
a plurality of divided voltages having different voltage values are output by dividing a power-supply voltage in accordance with the switching signal, and
a divided voltage to serve as the reference voltage is selected from the plurality of divided voltages in accordance with a logic level of the input signal.

18. The method according to claim 17,
wherein, when the plurality of divided voltages are output,
the plurality of divided voltages are generated using a plurality of voltage-dividing resistors that are coupled between a high-potential power-supply voltage and a low-potential power-supply voltage, and that have a plurality of different division ratios, and
a closure signal output in accordance with the switching signal is used to close at least one of a plurality of switching parts, the at least one of the plurality of switching parts being coupled to one of the plurality of voltage-dividing resistors, the plurality of switching parts being each coupled either between the high-potential power-supply voltage and a corresponding one of the plurality of voltage-dividing resistors, or between the low-potential power-supply voltage and a corresponding one of the plurality of voltage-dividing resistors, or being coupled both between the high-potential power-supply voltage and the plurality of corresponding voltage-dividing resistors and between the low-potential power-supply voltage and the plurality of corresponding voltage-dividing resistors.

19. The method according to claim 18,
wherein a time constant of an integrating circuit comprising a resistance of one of the voltage-dividing resistors and a parasitic capacitance coupled to the voltage-dividing resistor is set so that a time taken to cause a value of the divided voltage to reach a target voltage value is shorter than a test cycle time obtained by dividing a target measurement time taken to measure the drive capabilities by the number of cases in which the drive capabilities are tested.

20. The method according to claim 19,
wherein, when the closure signal is output, the closure signal is produced on the basis of an AND operation of a drive-capability measurement command signal and the switching signal, the drive-capability measurement command signal being used to command the start of measurement of one of the drive capabilities.

* * * * *